United States Patent
Hakamada

[11] Patent Number: 6,146,964
[45] Date of Patent: Nov. 14, 2000

[54] METHOD OF MANUFACTURING A SEMICONDUCTOR DEVICE HAVING A FIN TYPE CAPACITOR ELECTRODE

[75] Inventor: Shinichi Hakamada, Tokyo, Japan

[73] Assignee: Oki Electric Industry Co., Ltd., Tokyo, Japan

[21] Appl. No.: 09/094,488

[22] Filed: Jun. 10, 1998

[30] Foreign Application Priority Data

Jun. 13, 1997 [JP] Japan ................................. 9-156570

[51] Int. Cl.⁷ ................................................ H01L 21/20
[52] U.S. Cl. .......................................... 438/397; 438/254
[58] Field of Search .................................... 438/254, 397

[56] References Cited

U.S. PATENT DOCUMENTS

| | | | |
|---|---|---|---|
| 5,128,273 | 7/1992 | Ema ........................................ | 438/253 |
| 5,206,787 | 4/1993 | Fujioka ................................... | 257/307 |
| 5,223,729 | 6/1993 | Kudoh et al. .......................... | 257/296 |
| 5,384,267 | 1/1995 | Ogawa et al. ......................... | 438/254 |
| 5,416,037 | 5/1995 | Sato et al. .............................. | 438/254 |
| 5,460,999 | 10/1995 | Hong et al. ............................ | 438/397 |
| 5,622,882 | 4/1997 | Yee ....................................... | 438/210 |
| 5,721,152 | 2/1998 | Jenq et al. ............................. | 438/397 |

*Primary Examiner*—Amir Zarabian
*Assistant Examiner*—Christian D. Wilson
*Attorney, Agent, or Firm*—Rabin & Champagne, PC

[57] ABSTRACT

The method according to this invention, of manufacturing a semiconductor device includes forming a polysilicon layer on a silicon substrate, forming a first resist pattern on the polysilicon layer, introducing impurity ions into the polysilicon layer with the first resist pattern used as a mask to form a high density impurity layer within the polysilicon layer, forming a second resist pattern on the polysilicon layer at a region where the first resist pattern is formed, the second resist pattern being greater than the first resist pattern so that the region where the first resist pattern is formed and a peripheral region thereof is covered by the second resist pattern, and etching the polysilicon layer including the high density impurity layer using the second resist pattern as a mask. From the above method, a portion of the polysilicon layer located at a region not covered by the second resist layer and the high density impurity layer are etched.

10 Claims, 7 Drawing Sheets

METHOD OF MANUFACTURING A SEMICONDUCTOR DEVICE HAVING A FIN TYPE CAPACITOR ELECTRODE

BACKGROUND OF THE INVENTION

The present invention relates to a method of manufacturing a semiconductor device such as particularly dynamic random access memory (DRAM), particularly a semiconductor device having a capacitor with a fin type electrode.

A DRAM has been making a remarkable progress in its integration level. In recent years, 64 megabit DRAM has been already of practical use. In addition to remarkable progress of fine process technology, improvement of memory cell, structure also made a great contribution to the higher integration. Requirements for the higher integration of a DRAM brought about a semiconductor elements with a finer dimension. However, it caused a new problem; shortage (decrease in) of capacitor capacity. In order to recover the shortage of the capacitor capacity, polysilicon storing electric charge is usually formed being put on another to make multi-layer. One method is to form a so-called "fin structure", where a storage electrode is provided with a horizontal groove.

However, a problem about the prior art is that the manufacturing method of the fin type electrode of a capacitor element needs lots of time and manpower because of its complicated process. Another problem about the prior art is that shrinkage of a semiconductor element is difficult due to element's size limited by a marginal opening dimension of the contact because pattern dimension of the first polysilicon layer must be smaller than contact dimension of the intermediate film.

SUMMARY OF THE INVENTION

It is an object of this invention to provide a method of manufacturing a semiconductor device wherein the fin type capacitor electrode can be easily and accurately formed, a manufacturing process can be extremely simplified and a shrinkage of a semiconductor element can be achieved.

The method according to this invention, of manufacturing a semiconductor device comprises steps of forming a polysilicon layer on a silicon substrate, forming a first resist pattern on the polysilicon layer, introducing impurity ions into the polysilicon layer with the first resist pattern used as a mask to form a high density impurity layer within the polysilicon layer, forming a second resist pattern on the polysilicon layer at a region where the first resist pattern is formed, the second resist pattern being greater than the first resist pattern so that the region where the first resist pattern is formed and a peripheral region thereof is covered by the second resist pattern, and etching the polysilicon layer including the high density impurity layer using the second resist pattern as a mask. From the above method, a portion of the polysilicon layer located at a region where the second resist layer is not covered and the high density impurity layer are etched.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENT

FIGS. 1 to 5 are sectional views showing a method of manufacturing a semiconductor device according to the first embodiment of this invention, comprising the following steps.

Figure 1:
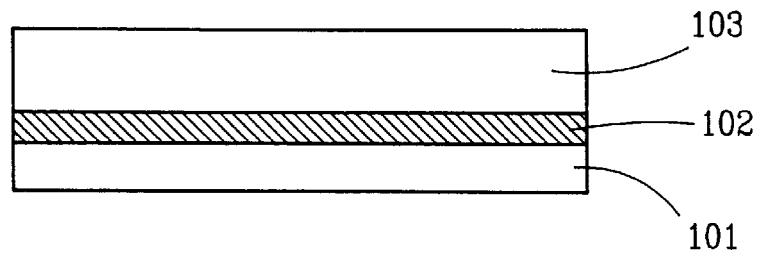
FIG. 1 to FIG. 5 are sectional views showing a method of manufacturing a semiconductor device according to the first embodiment of the present invention.

As shown in FIG. 1, an oxide film 102 is formed on a silicon substrate 101 by LOCOS or other methods, and a polysilicon film 103 is formed on the oxide film 102.

Figure 2:
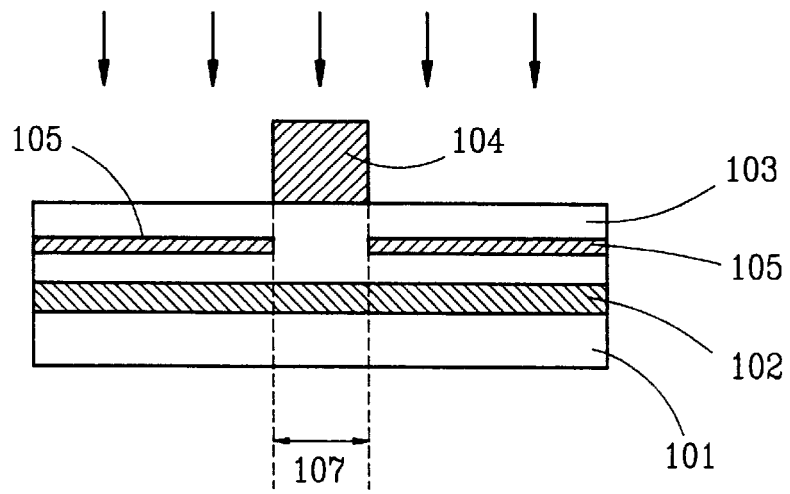

As shown in FIG. 2, a resist pattern 104 (the first resist pattern) is formed on the polysilicon film 103, and a layer of impurity of high density 105 is formed in the polysilicon film 103 by introducing impurity ions made of As into the polysilicon film 103 by using the resist pattern 104 as a mask on the condition of introducing energy of 40 kev and density of 2.0×10 16 ions/cm2. The resist pattern 104 should be formed so At thickly that the impurity of As can not be shot into the polysilicon film 103 just under the resist pattern 104 during the introducing. Thus, the layer of impurity of high density is formed, during the introducing, at a position so that the layer is center is a predetermined depth from a top of the polysilicon film 103.

Figure 3:
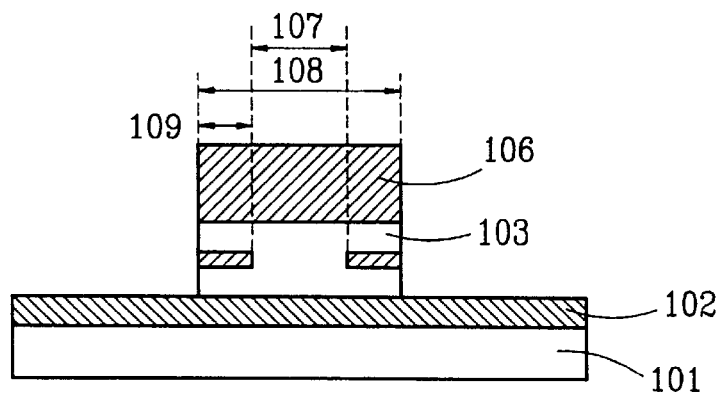

Then, as shown in FIG. 3, a resist pattern 106 (the second resist pattern) is formed, after the resist pattern 104 (the first resist pattern) is removed. The resist pattern 106 (the second resist pattern) should be formed to have a greater size than the resist pattern 104 (the first resist pattern) and at a position overlapping the resist pattern 104. In other words, the resist pattern 106 is formed with a dimension and at a position, wherein a pattern width 108 of the resist pattern 106 is greater than a pattern width 107 of the resist pattern 104 and a difference 109 is given on the both sides of the resist pattern 106. The pattern width 107 is a non-introducing area of impurity and the difference 109 is equal to side-etching depth described below.

The polysilicon film 103 including the layer of impurity of high density 105 is provided with dry etching by reactive ion etching (hereinafter called "RIE"). During the dry etching, the denser the layer of impurity of As is, the faster the etching speed must be and the thinner a protection film made of reactants formed on the side of the polysilicon film 103 must be. For this purpose, etching conditions are set at 30 sccm for CL2 gas, 10 mTorr for pressure and 250 W for RF POWER.

Figure 4:
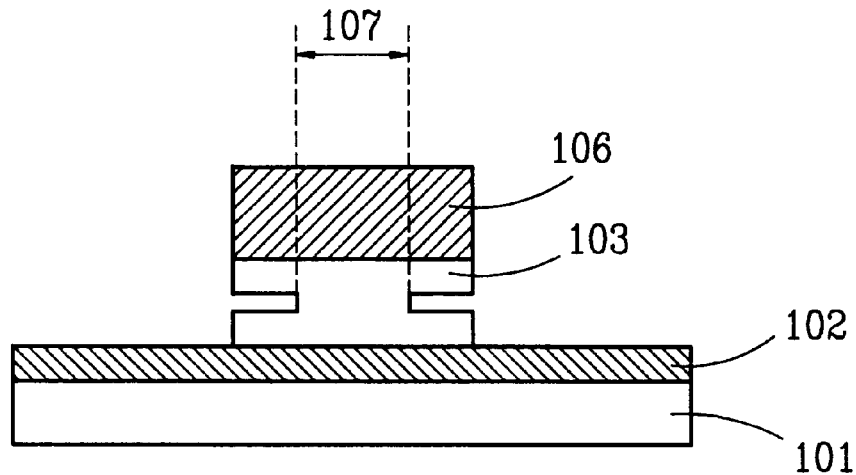
Figure 5:
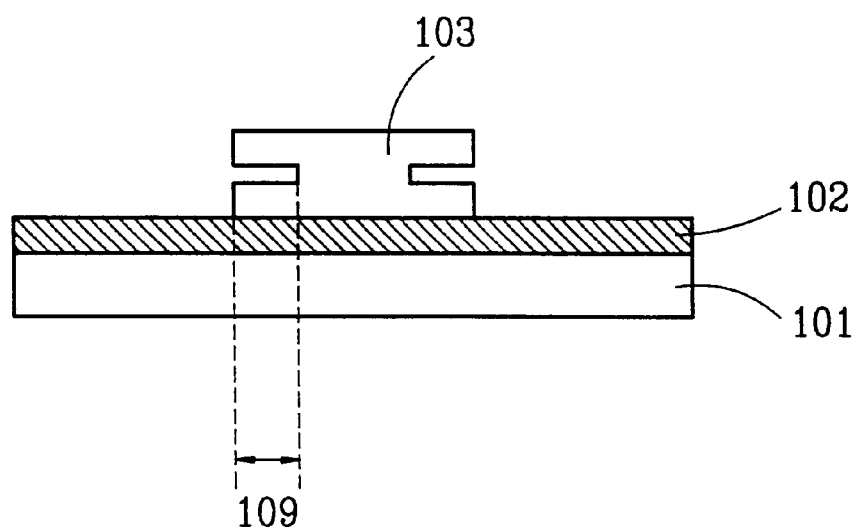

When etching is performed to the polysilicon film 103 under this condition, the layer of impurity of high density 105 is partially provided with the side-etching, as shown in FIG. 4, going through a protection film of reactants sticking to the sides of the polysilicon film 103. Thus, the fin type electrode of the polysilicon film 103 is formed, as shown in FIG. 5, after removing the resist pattern 106 by oxygen plasma for example. The side-etching depth is equal to the difference 109 between the pattern width 107 of the resist pattern 104 and the pattern width 108 of the resist pattern 106, which makes the fin structure of electrode of the polysilicon film 103.

Figure 6:
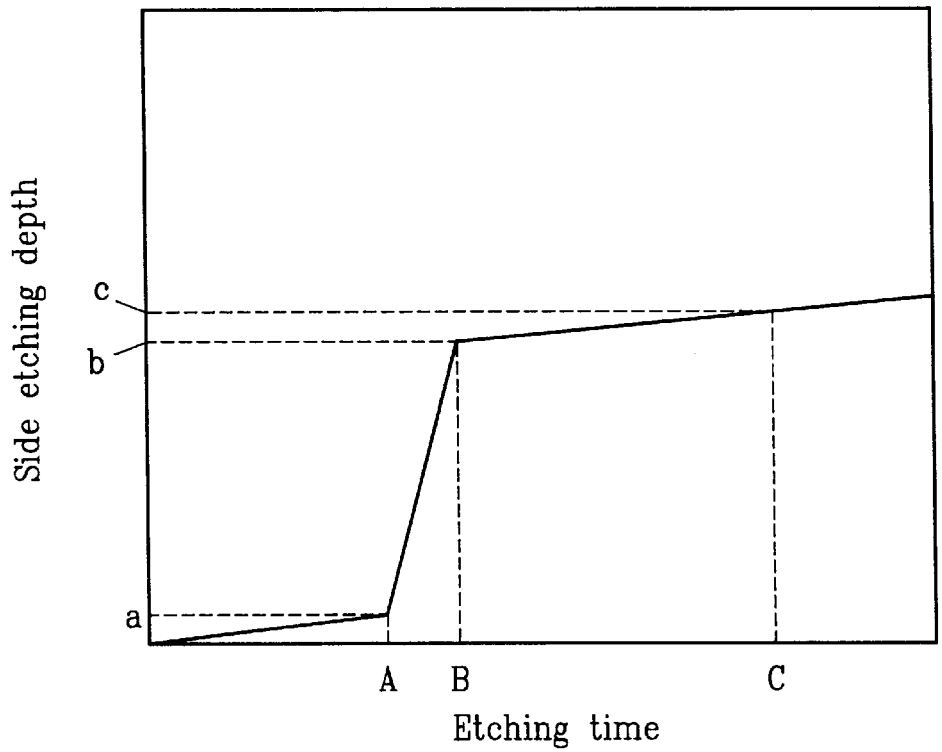
FIG. 6 is a graph showing relationship between side-etching depth and etching time.

FIG. 6 shows a relationship between the side-etching depth and etching time, wherein A represents just-etching time (time when etched film of the polysilicon is all etched), B represents time when side-etching is completed up to the end of the layer of impurity of high density and C represents etching-finished time. As shown in FIG. 6, the side-etching progresses so rapidly after the just-etching time A, proceeding up to the end of the layer of impurity of high density 105 at a sitting. Afterward the side-etching slows down when it reaches a non-introduced area of impurity 107. Accordingly, the etching-finished time C can be selected long after the just-etching time B because increase of the side-etching depth is limited after the just-etching time B. By setting the etching-finished time C long considering shake or sway of the process, the side-etching depth can be controlled accurately.

Figure 7:
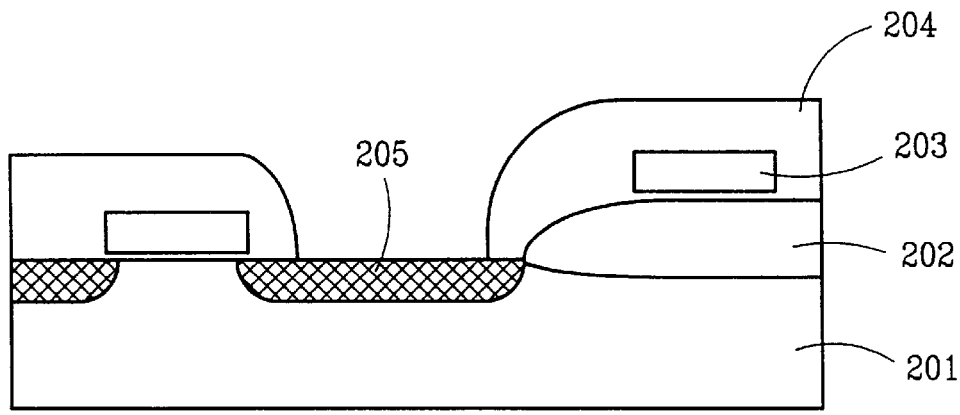
FIG. 7 is a sectional view showing pre-process of a method of manufacturing a semiconductor device according to the first embodiment of the present invention.
Figure 8:
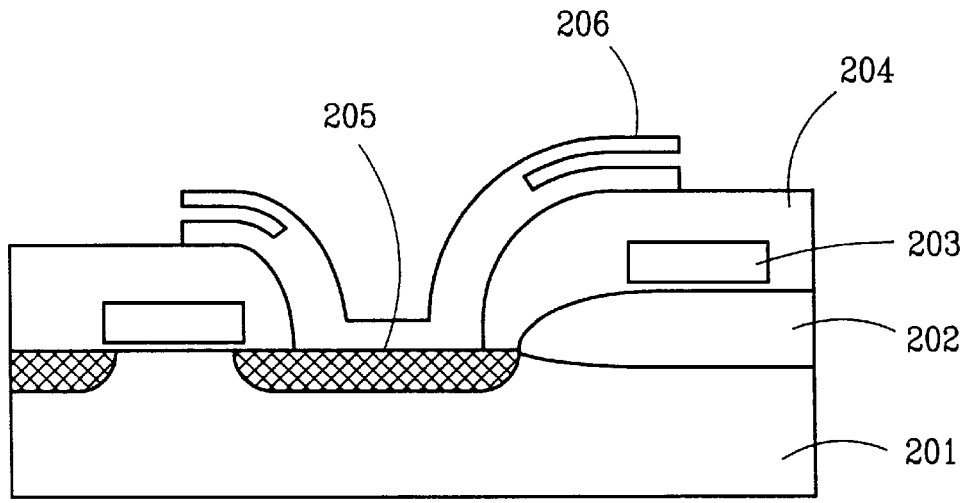
FIG. 8 is a sectional view showing an example of forming the fin type capacitor electrode according to the first embodiment of the present invention.
Figure 9:
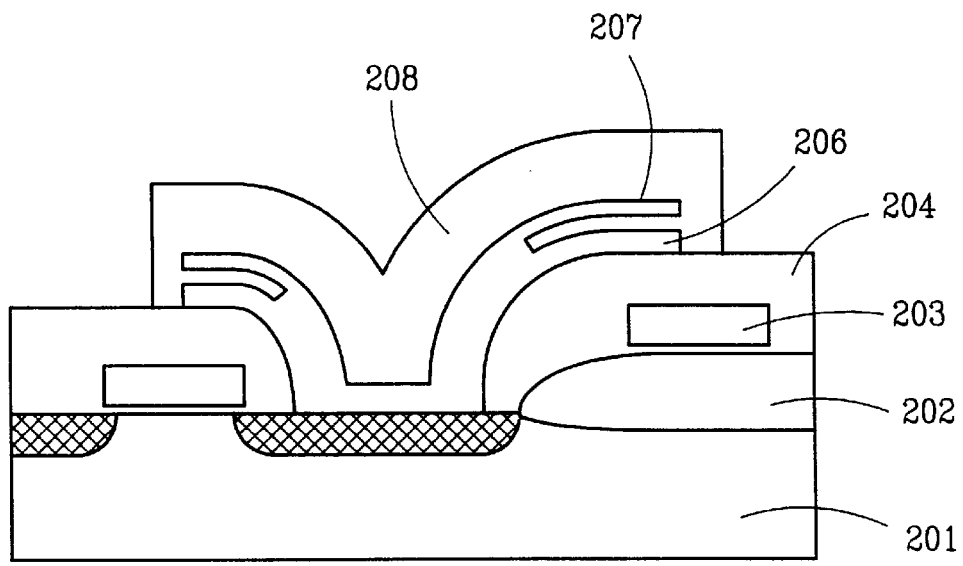
FIG. 9 is a sectional view showing one example of a capacitor having the fin type electrode according to the first embodiment of the present invention.

FIGS. 7 to 9 are sectional views showing processes of forming the fin type capacitor electrode, wherein the following processes are included.

As shown in FIG. 7, a field oxide film 202 is selectively formed on a silicon substrate to determine active areas by means like LOCOS, the polysilicon film 203 is formed, an intermediate insulation film 204 like SiN film or SiO film is formed and a contact hole 205 is formed in the intermediate insulation film 204 by photolithography etching. Then, as shown in FIG. 8, a fin type capacitor electrode 206 is formed by a method having the processes shown in FIGS. 1 to 5, comprising steps of (1) forming a polysilicon film on the contact hole 205, and a first resist pattern on the polysilicon (refer to FIG. 1);

(2) forming a layer of impurity of high density in the polysilicon film by introducing impurity ions into the polysilicon film using the first resist pattern as a mask (refer to FIG. 2);

(3) removing the first resist pattern and forming a second resist pattern which is greater in width than the first resist pattern and aligned at a position overlapping with the first resist pattern (refer to FIG. 3);

(4) etching the polysilicon film by using the second resist pattern as a mask, wherein the layer of impurity of high density is provided with side-etching (refer to FIG. 4); and (5) removing the second resist pattern (refer to FIG. 5), respectively in order.

Then, as shown in FIG. 9, a thermal oxide film by diffusion method and a dielectric film 207 made of SiN or SiO2 by CVD method are formed on the surface of the fin type capacitor electrode 206 and a plate electrode 208 of a polysilicon is placed on the dielectric film 207.

The process to make the fin type capacitor electrode is completed by the method described above. In addition, an insulation film, a metal wiring layer and a passivation film are provided, not illustrated in Figures.

As fully described above, a method of manufacturing a semiconductor device according to the first embodiment comprises forming the polysilicon 103 on the silicon substrate 101 and the resist pattern 104 (the first resist pattern) on the polysilicon film 103, forming the layer of impurity of high density 105 in the polysilicon film 103 by introducing impurity of As into the polysilicon film 103 using the resist pattern 104 as a mask, removing the resist pattern 104, forming the resist pattern 106 (the second resist pattern) which is greater in width than the resist pattern 104 and aligned at the position overlapping with the resist pattern 104, providing the polysilicon film 103 including the layer of impurity of high density 105 with etching by using the resist pattern 106 as a mask and removing the resist pattern 106, in order. The first embodiment allows the omission of a total of 9 processes required for the prior art; a total of 6 processes including two processes respectively for forming resist patterns, etching and removing resist patterns, besides 3 processes of forming an intermediate film and a second polysilicon and removing the intermediate film. In addition, the first embodiment ensures the fin type electrode of the polysilicon is formed accurately.

FIGS. 10 to 13 are sectional views showing a method of manufacturing a semiconductor device according to a second embodiment of the present invention. For describing the second embodiment, the same numbers are used for the same parts of structures as are used in description of the first embodiment. The second embodiment includes the following processes.

Figure 10:
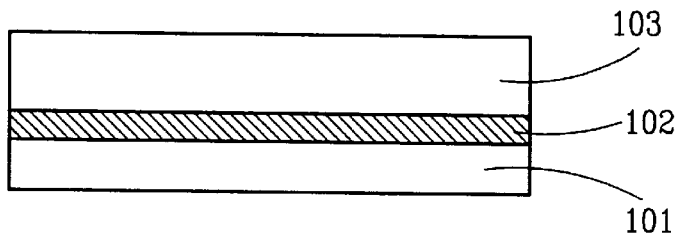
FIGS. 10 to 13 are sectional views showing a method of manufacturing a semiconductor device according to the second embodiment of the present invention.
Figure 11:
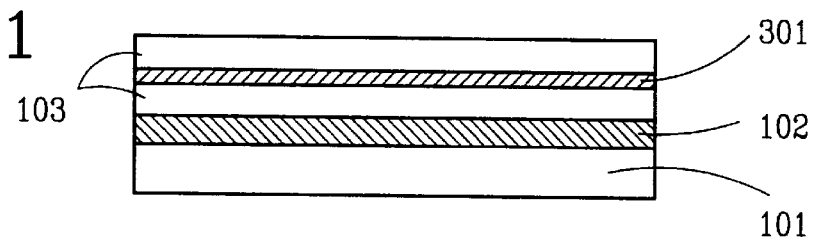
Figure 12:
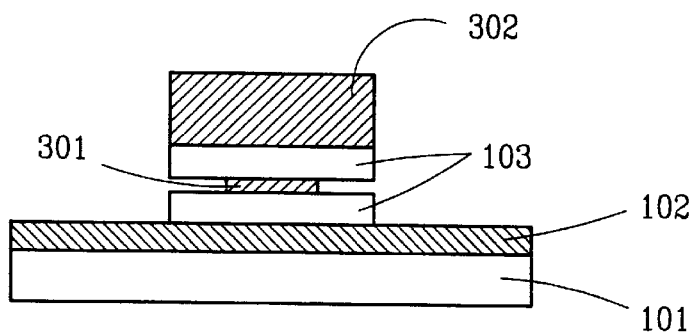

At first, as shown in FIG. 10, the oxide film 102 is formed on the silicon substrate 101 by using LOCOS method and the polysilicon film 103 is formed on the oxide film 102. As shown in FIG. 11, a layer of impurity of high density 301 is formed in the polysilicon 103 by introducing impurity ions made of As into the whole surface of the polysilicon 103 under the condition of 40kev for acceleration energy and density of $2.0 \times 10^{16}$ ions/cm2. Then, as shown in FIG. 12, a resist pattern 302 is formed on the polysilicon film 103 and the polysilicon 103 including the layer of impurity of high density 301 is dry etched by RIE using the resist pattern 302 as a mask. The same etching condition as is used for the first embodiment is used until the whole surface of the polysilicon film 103 is entirely etched. Then, the etching condition is changed to mixed gas consisting CL2 with rate of flow of 7 sccm, HBr with 60 sccm and 02 of 1.2 sccm, pressure of 75 mTorr and RF POWER of 125 W in order to slow down the etching speed to get better control of side-etching depth.

Figure 13:
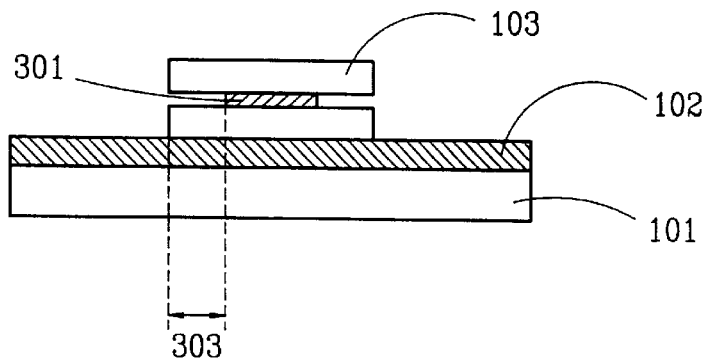

When etching is performed to the polysilicon film 103 under this condition, the layer of impurity of high density 301 is partially provided with side-etching in the same manner as in the first embodiment. The fin type electrode of polysilicon film 103 is formed, as shown in FIG. 13, after removing the resist pattern 302 by oxygen plasma for example. Side-etching depth shown in FIG. 13 makes the fin type electrode of the polysilicon film 103.

Figure 14:
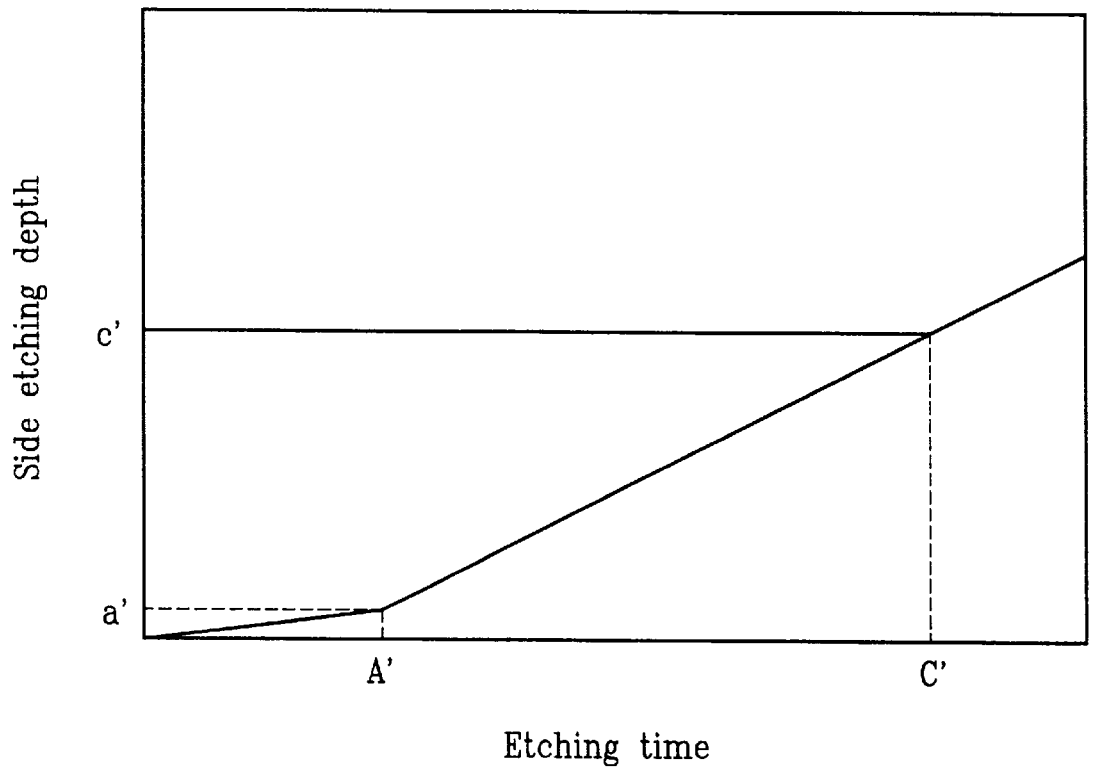
FIG. 14 is a graph showing relationship between side-etching depth and etching time.

FIG. 14 shows the relationship between side-etching depth and etching time, wherein A' represents just-etching time and C' etching-finished time. As shown in FIG. 14, side-etching progresses with increasing speed after reaching the just-etching time A' (time when etched film of the polysilicon is entirely etched). However, the rate of the increasing speed is less than that of the first embodiment shown in FIG. 6 because etching conditions are so set as to make the etching speed slow.

As described above, the method of manufacturing a semiconductor device according to the second embodiment comprises forming the polysilicon film 103 on the silicon substrate 101, forming the layer of impurity of high density 301 in the polysilicon film 103 by introducing impurity ions of As into the polysilicon film 103, forming the resist pattern 302 on the polysilicon film 301, providing the polysilicon film 103 including the layer of impurity of high density 301 by using the resist pattern 302 as a mask and removing the resist pattern 103, in order. The second embodiment allows processes required for the prior art to be omitted to a large extent, just as the first embodiment does. Also, the second embodiment can make a capacitor element smaller because it does not need to make the resist pattern 302 smaller than the pattern of the polysilicon film 103.

FIGS. 15 to 18 are sectional views showing a method of manufacturing a semiconductor device according to a third embodiment. For describing the third embodiment, the same numbers are used for the same structures as are used for description of the first and the second embodiments.

Figure 15:
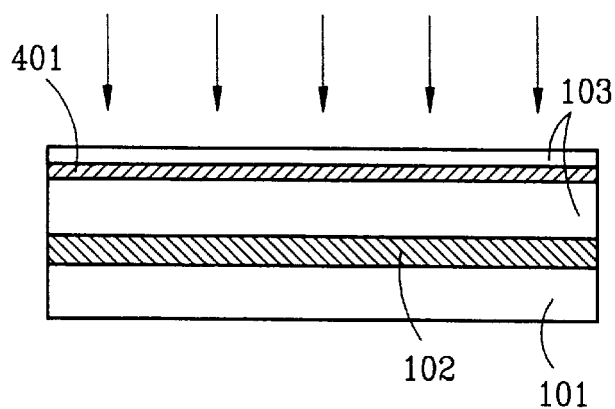
FIGS. 15 to 18 are sectional views showing a method of manufacturing a semiconductor device according to the third embodiment of the present invention.
Figure 16:
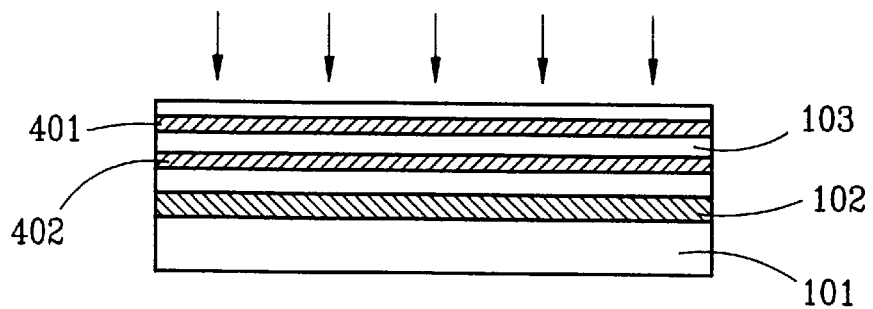

The same processes used in the first and the second embodiment are employed until the polysilicon 103 is formed. As shown in FIG. 15, a layer of impurity of high density 401 (the first layer of impurity of high density) is formed in the polysilicon film 103 by introducing impurity ions made of As into the whole surface of the polysilicon film 103 under the condition of acceleration energy with 40 kev and density of 2.0×10 16 ions/cm2. Then, as shown in FIG. 16, a layer of impurity of high density 402 (the second layer of impurity of high density) is formed in the polysilicon 103 by introducing impurity ions made of As again into the polysilicon film 103 including the layer of impurity of high density 401. By doing this, 2 layers of impurity of high density are formed in the polysilicon film 103. Acceleration voltage V2 of the 2nd introducing (introducing condition: acceleration energy of 120 kev and density of 2.0×10 16 ions/cm2) should be sufficiently greater than acceleration voltage Vl of the 1st introducing (introducing condition: acceleration energy of 40 kev and density of 2.0×10 16 ions/cm2) (V2>>V1), in order for the second layer not to be formed at the same position as the first layer.

Figure 17:
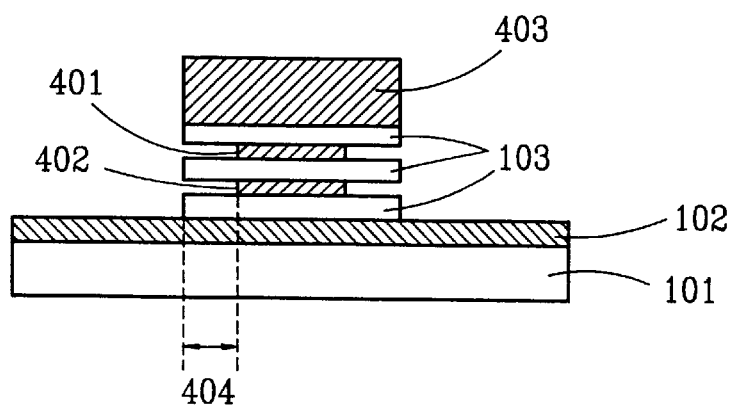
Figure 18:
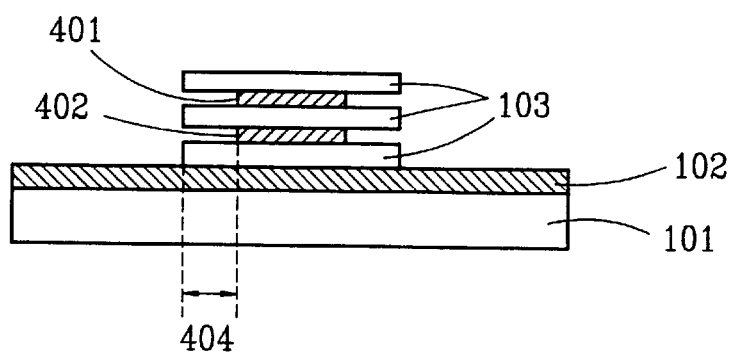

Then, as shown in FIG. 17, a resist pattern 403 is formed on the polysilicon film 103, and the polysilicon film 103 including the layers of impurity of high density 401 and 402 are dry etched by RIE by using the resist pattern 403 as a mask. Etching conditions for the third embodiment are the same as that for the second embodiment. When etching is performed to the polysilicon film 103 under this condition, the layers of impurity of high density 401 and 402 formed in the polysilicon film 103 are partially provided with side-etching, as shown in FIG. 17, in the same manner as the second embodiment. Side-etching depth shown in FIG. 18 makes the fin structure of two layers of electrode of the polysilicon film 103.

As described above, the method of manufacturing a semiconductor device according to the third embodiment comprises forming the polysilicon film 103 on the silicon substrate 101, forming the two layers of impurity of high density 401 and 402 in the polysilicon film 103 by introducing impurity ions of As into the polysilicon film 103 two times with changed acceleration voltages, forming the resist pattern 403 on the polysilicon film 103, providing the polysilicon film 103 including the two layers of impurity of high density 401 and 402 with etching by using the resist pattern 403 as a mask and removing the resist pattern 403, in order. The third embodiment enables omission of processes required for the prior art to the large extent and shrinkage of element size as the second and the third embodiments do. Especially, in the third embodiment, lots of the fin structures can be formed with only one etching by providing multiple-time introducing of impurity with different acceleration voltages. The lots of the fins enable capacitor capacity to be bigger, with increased surface area of a capacitor electrode. The bigger capacitor capacity can extend refresh cycle for example.

The third embodiment shows an example, wherein the two layers of impurity of high density 401 and 402 are formed in the polysilicon film 103. However, more than two layers may be formed to obtain bigger surface area of a capacitor. The three embodiments may be applicable to a capacitor used in a DRAM cell and also may be applicable to any other semiconductor devices having the fin type capacitor electrode than the DRAM cell. The three embodiments may be applicable to any semiconductor integrated circuits requiring big electrostatic capacity in small area.

Although impurity made of As is introduced into the polysilicon in example shown in the three embodiments, a similar fin type capacitor electrode can be formed even if changing impurity of As to phosphorus (P). However, when using P as impurity, acceleration voltage must be smaller than that for As because P has a longer traveling distance. Many variations in kind of impurity and introducing condition can be employed for the embodiments.

In addition, the three embodiments may be applicable to any semiconductor device, if having the fin type capacitor electrode in it, of any structure, any manufacturing process, any method of manufacturing a capacitor dielectric film and other parts of the semiconductor device and any position of various electrodes.

What is claimed is:

1. A method of manufacturing a semiconductor device: comprising:

forming a polysilicon layer on a silicon substrate;

forming a first resist pattern on the polysilicon layer;

introducing impurity ions into the polysilicon layer with the first resist pattern being used as a mask to form a high density impurity layer within the polysilicon layer;

forming a second resist pattern on the polysilicon layer at a region where the first resist pattern is formed, the second resist pattern being greater in size than the first resist pattern so that the region where the first resist pattern is formed and a peripheral region thereof is covered by the second resist pattern; and etching the polysilicon layer including the high density impurity layer using the second resist pattern as a mask so as to etch the high density impurity layer and a portion of the polysilicon layer not covered be the second resist layer.

2. A method of manufacturing a semiconductor device according to claim 1, wherein the high density impurity layer is formed at a center position in depth from the top of the polysilicon layer.

3. A method of manufacturing a semiconductor device according to claim 1, wherein the first resist pattern is formed so thickly that the impurities are prevented from being introduced into the polysilicon layer under the first resist pattern.

4. A method of manufacturing a semiconductor device according to claim 1, further comprising:

forming a dielectric layer on the surface of the etched polysilicon layer; and forming a plate electrode layer on the dielectric layer to form a fin type capacitor.

5. A method of manufacturing a semiconductor device according to claim 1, wherein said etching the polysilicon layer includes:

vertically etching a portion of the polysilicon layer and the high density impurity layer not covered by the second resist layer; and horizontally etching the peripheral region of the high density impurity layer.

6. A method of manufacturing a semiconductor device according to claim 1, wherein said polysilicon layer has an etching time including a time for vertically etching the polysilicon layer, including the high density impurity layer and a time for horizontally etching the high density impurity layer.

7. A method of manufacturing a semiconductor device having a fin type capacitor electrode comprising:

forming a polysilicon layer on a silicon substrate;

introducing impurity ions into the polysilicon layer to form a high density impurity layer within the polysilicon layer;

forming a first resist pattern on the polysilicon layer including the high density impurity layer;

etching the polysilicon layer including the high density impurity layer, including vertically etching a portion of the polysilicon layer including the high density impurity layer not covered by the first resist layer using the first resist pattern as a mask, and horizontally etching a peripheral region of the high density impurity layer under the first resist pattern so that a fin type polysilicon layer is formed;

forming a dielectric layer on the surface of the fin type polysilicon layer; and forming a plate electrode layer on the dielectric layer to form a fin type capacitors, wherein the high density impurity layer is formed in the polysilicon layer except a region surrounded by the peripheral region.

8. A method of manufacturing a semiconductor device according to claim 7, wherein the silicon substrate includes a single crystallized silicon substrate, a field oxidation layer formed on the single crystallized silicon substrate, a transistor formed on the single crystallized silicon substrate and an interlayer insulating layer formed on the transistor.

9. A method of manufacturing a semiconductor device according to claim 7 wherein the introducing impurity ions includes:

forming a second resist pattern on the polysilicon layer at the region surrounded by the peripheral region; and introducing impurity ions into the polysilicon layer with the second resist pattern used as a mask to form a high density impurity layer within the polysilicon layer.

10. A method of manufacturing a semiconductor device according to claim 7, wherein the high density impurity layer is formed at a center position in depth from the top of the polysilicon layer.

* * * * *